United States Patent
Hwang et al.

(10) Patent No.: US 6,855,376 B2
(45) Date of Patent: Feb. 15, 2005

(54) PROCESS OF DIRECT GROWTH OF CARBON NANOTUBES ON A SUBSTRATE AT LOW TEMPERATURE

(75) Inventors: Chien-Liang Hwang, Hsinchu (TW); Jack Ting, Taipei (TW); Jih-Shun Chiang, Hsinchu (TW); Chuan Chuang, Hsinchu (TW)

(73) Assignee: Industrial Technology Research Institute, Chutung (TW)

(*) Notice: Subject to any disclaimer, the term of this patent is extended or adjusted under 35 U.S.C. 154(b) by 220 days.

(21) Appl. No.: 10/237,695

(22) Filed: Sep. 10, 2002

(65) Prior Publication Data

US 2003/0180461 A1 Sep. 25, 2003

(30) Foreign Application Priority Data

Mar. 25, 2002 (TW) .................... 91105805 A

(51) Int. Cl.[7] .................. B05D 1/36; C23D 8/00; C23C 16/00; C23C 28/00; C25D 5/12
(52) U.S. Cl. .............. 427/404; 427/406; 427/585; 427/250; 427/255.28; 204/192.1; 205/170; 205/181; 205/183; 205/186; 205/191; 205/192
(58) Field of Search .................. 204/192.1; 427/404, 427/406, 585, 250, 255.28; 205/170, 181, 183, 186, 191, 192

(56) References Cited

U.S. PATENT DOCUMENTS 6,672,926 B2 * 1/2004 Liu et al. ............... 445/51
2002/0160111 A1 * 10/2002 Sun et al. ............... 427/248.1

FOREIGN PATENT DOCUMENTS

EP   1 061 041 A1   12/2000
EP   1 061 043 A1   12/2000

* cited by examiner

*Primary Examiner*—Edna Wong
(74) *Attorney, Agent, or Firm*—Bacon & Thomas

(57) ABSTRACT

Carbon nanotubes are directly grown on a substrate surface having three metal layers thereon by a thermal chemical vapor deposition at low-temperature, which can be used as an electron emission source for field emission displays. The three layers include a layer of an active metal catalyst sandwiched between a thick metal support layer formed on the substrate and a bonding metal layer. The active metal catalyst is iron, cobalt, nickel or an alloy thereof; the metal support and the bonding metal independently are Au, Ag, Cu, Pd, Pt or an alloy thereof; and they can be formed by sputtering, chemical vapor deposition, physical vapor deposition, screen printing or electroplating.

12 Claims, 1 Drawing Sheet

PROCESS OF DIRECT GROWTH OF CARBON NANOTUBES ON A SUBSTRATE AT LOW TEMPERATURE

FIELD OF THE INVENTION

The present invention relates to a process for producing carbon nanotubes, and particularly to a process for directly growing carbon nanotubes on an active catalyst system having a sandwiched structure by thermal chemical vapor deposition (CVD) at low temperature.

BACKGROUND OF THE INVENTION

Carbon nanotubes have very special properties, such as low density, high strength, high toughness, high flexibility, high surface area, high surface curvature, high thermal conductivity, and excellent electric conductivity, etc. That is why carbon nanotubes have attracted many researchers to study on the possible applications of the carbon nanotubes which include: composite material, microelectronic components, flat displays, radio communication, fuel cells, and lithium cells, etc. Carbon nanotube field emission displays (CNT-FED) are novel flat displays that have a great potential. Usually, a process for producing a large CNT-FED comprises: mixing carbon nanotubes with a conductive paste; coating the paste mixture on the surface of a conductive glass substrate by a screen printing technique, or the like; sintering the composite at 450–550° C. to remove the polymeric material in the paste mixture, thereby forming an electron emissive film having a good electrical conductivity. Such a CNT-FED production process requires several steps and uses a technique that is somehow cumbersome. Furthermore, the carbon nanotubes are difficult to be uniformly distributed in said conductive paste.

At present, the processes for producing nanotubes for use in the CNT-FED include: arc discharge, laser vaporization, and thermal CVD, etc. The carbon nanotube products prepared by the arc discharge process and the laser vaporization process not only are difficult to be controlled as to the length and the diameter thereof, but they are produced in a rather low yield. Furthermore, those processes will generate a large amount of amorphous carbon, so that further purification treatments are required. Moreover, these processes require a fabrication temperature exceeding 1000° C. such that carbon nanotubes can not be produced directly on a glass substrate. Therefore, it is widely recognized that a thermal CVD has the best possibility for producing carbon nanotubes at a lower temperature.

In the past, a process for producing carbon nanotubes by a thermal CVD uses an active metal catalyst deposited on a porous support such as silica, zeolite, alumina or magnesium oxide. The main reason in selecting the abovementioned supports is that such supports are stable inert oxides, and they will not react with the active metal catalyst inadvertently during a heating process, so that the active metal catalyst can catalyze a synthesis reaction of the carbon nanotubes as desired. The active metal mainly comprises: Fe, Co or Ni, and a minor quantity of other metals, such as Cu, Mo, Mn, Zn or Pt, etc., for adjusting the reaction activities. The reaction conditions of using an active metal catalyst, which is deposited on a support, to catalyze a carbon accumulation reaction for forming carbon nanotubes include: introducing an inert gas (He, Ar, or $N_2$), hydrogen and a carbon source gas into a reactor at a reaction temperature of 650–1000° C. and a pressure of 1–2 atm for a reaction time of 1–120 min. The carbon source used includes: a hydrocarbon or carbon monoxide (CO). Upon completion of the reactions, the support needs to be removed by acid washing in order to obtain purer carbon nanotubes for use in a CNT-FED or other applications.

In the current CNT-FED fabrication process, the abovementioned cumbersome steps are needed for adhering carbon nanotubes to the surface of the substrate. As a result, the distribution and the orientation of the carbon nanotubes on the surface of the substrate are influenced by many process factors, such as the purity and specification of the carbon nanotubes, the amount of addition and the dispersion of the carbon nanotubes in the paste/nanotubes mixing step, and the technique of the screen printing, etc. These factors inevitably reduce the yield of the CNT-FED, and thus increase the production cost thereof. However, most of the above problems will vanish if the carbon nanotubes can be grown directly on the surface of the substrate, thereby greatly improving the CNT-FED production process. Furthermore, the synthesis of carbon nanotubes will become a module in the CNT-FED production process. The whole production steps can be systematically monitored in one process, thereby increasing the yield of the CNT-FED.

Generally speaking, the strain temperature of the calcined temperature resistant glass can reach up to 650° C., while the strain temperature of the sodium glass is about 550° C. or lower. Therefore, if the thermal CVD is used to directly grow carbon nanotubes on the surface of the glass substrate, the thermal CVD temperature can not exceed the strain temperature of the glass substrate, i.e. preferably lower than 650° C. However, the thermal CVD temperature cannot be too low, since the catalytic activity of the thermal CVD catalyst will be reduced and become insufficient for use in the synthesis of the carbon nanotubes. Therefore, it is necessary to develop a high catalytic activity catalyst system which can be used in synthesizing the carbon nanotubes at a temperature lower than 650° C.

European Patent Application No. 1061041 A1 discloses a low temperature CVD device and a method for synthesizing carbon nanotubes using such a device. The method comprises dividing a reaction pipe in the device into a space adjacent to the gas input part, a first zone for pyrolyzing the input gases, and a space adjacent to the gas discharge part, a second zone for synthesizing carbon nanotubes by using the resulting pyrolyzed gases; and maintaining the temperatures of the two zones so that the temperature of the second zone is lower than the temperature of the first zone. Two different catalyst substrates are used in the synthesizing zone of carbon nanotubes, wherein one substrate has an assist catalyst such as Pd, Cr and Pt, etc., which is mainly used to accelerate the pyrolysis of acetylene; the other substrate is deposited with a catalyst layer containing Fe, Co, Ni or an alloy thereof, which is a catalyst for synthesizing the carbon nanotubes. Said other catalyst substrate having a catalyst membrane containing Fe, Co, Ni or an alloy thereof is corroded by an etching gas to form nano-grade catalytic particles. The abovementioned device is used to pyrolyze a carbon source gas in the first zone by the assist catalyst. Then, in the second zone, the carbon source gas, which has been decomposed, is used to grow perpendicularly aligned carbon nanotubes on each isolated nano-grade catalytic particle on the substrate by the thermal CVD at a temperature equal to or lower than the strain temperature of the substrate. This prior art technique, in addition to using a low temperature reaction zone of 450–650° C., still needs to pyrolyze the carbon source gas (first zone) at a high temperature of 700–1000° C., and is not a pure low temperature process. This prior art technique also needs to use a special CVD reactor. Furthermore, in this prior art technique, it is necessary to form two types of metal catalyst layers on two substrates, and the two substrates are mounted in the thermal CVD such that the two metal layers are facing each other at a clearance. Obviously, this prior art technique is complex, costly, and difficult to be implemented.

European Patent Application No. 1061043 A1 discloses a method for synthesizing carbon nanotubes at a low temperature by using a metal catalyst layer, which comprises: forming a metal catalyst layer on a substrate, wherein said metal catalyst layer is etched to form isolated nano-grade catalytic metal particles; and growing perpendicularly aligned carbon nanotubes on each isolated nano-grade catalytic particle on the substrate by a thermal CVD by passing a pyrolyzed carbon source gas at a temperature equal to or lower than the strain temperature of the substrate. Said pyrolyzed carbon source gas is formed by using a carbon-source-gas decomposing metal catalyst layer. In this prior art technique, it is necessary to form two different metal catalyst layers on two substrates, and then the two substrates are mounted in a thermal CVD reactor such that the metal layers are facing each other at a clearance. Obviously, this prior art technique is an improvement to the process disclosed in the above-mentioned EP1061041 A1. The major improvement comprises modifying a two-staged heating system into a one-staged heating system. However, this prior art technique has no conspicuous improvement over the catalyst system, which still requires the use of two different catalyst systems on two substrates.

SUMMARY OF THE INVENTION

A primary objective of the present invention is to provide a process of direct low-temperature growth of carbon nanotubes on a substrate, which is free of the drawbacks of the abovementioned prior art.

Another objective of the present invention is to provide a process of direct low-temperature growth of carbon nanotubes on a substrate, which has an advantage of easy preparation of the catalyst system thereof.

Still another objective of the present invention is to provide a process of direct low-temperature growth of carbon nanotubes on a substrate, which has an advantage of easy adjustment of the composition of the catalyst system thereof.

In order to accomplish aforesaid objectives of the present invention, a process of direct growth of carbon nanotubes on a substrate at low-temperature provided according to the present invention comprises the following steps:

a) forming a metal support layer on a substrate;
b) forming a metal catalyst layer on said metal support layer;
c) forming a bonding metal layer on said catalyst metal layer; and
d) growing carbon nanotubes on a surface of said substrate having said metal support layer, the metal catalyst layer and the bonding metal layer thereon by using a carbon source gas through a thermal chemical vapor deposition (CVD);
wherein said metal support layer and said bonding metal layer separately have a thickness of 0.1–50 microns, and the former is thicker than the later;
said metal support layer comprises a noble metal;
said bonding metal layer comprises a noble metal; and
said metal catalyst layer comprises a metal selected from the group consisting of Fe, Co, Ni, and an alloy thereof, preferably Ni.

Preferably, said metal support layer in Step (a) is formed by vacuum sputtering, CVD, physical vapor deposition (PVD), screen printing or electroplating. More preferably, said metal support layer in Step (a) is formed by using said screen printing to coat a paste on said substrate, said pasted being dispersed with particles of the noble metal having a particle size of 0.1–10 microns; and sintering the obtained coating layer.

Preferably, said metal catalyst layer in Step (b) is formed by vacuum sputtering, CVD, physical vapor deposition (PVD), screen printing or electroplating, and more preferably, by electroplating.

Preferably, said bonding metal layer in Step (c) is formed by vacuum sputtering, CVD, physical vapor deposition (PVD), screen printing or electroplating, and more preferably, said bonding metal layer in Step (c) is formed by coating a paste solution on said metal catalyst layer, said paste solution being dispersed with particles of a noble metal having a particle size of 0.1–10 microns; and drying the obtained coating layer.

Preferably, said metal support layer comprises silver, gold, Pt, Pd, or Cu, and more preferably, silver.

Preferably, said metal support layer and said bonding metal layer comprise a same noble metal.

Preferably, said thermal CVD in Step (d) is carried out under conditions of: a reaction temperature of 400–600° C., a pressure of 0.5–2 atm, and a reaction time of 1–120 minutes; and said carbon source gas comprises a hydrocarbon or carbon monoxide.

Other objectives and further features of the present invention are explained in the following through the following examples and drawing.

DETAILED DESCRIPTION OF PREFERRED EMBODIMENTS

Figure 1:
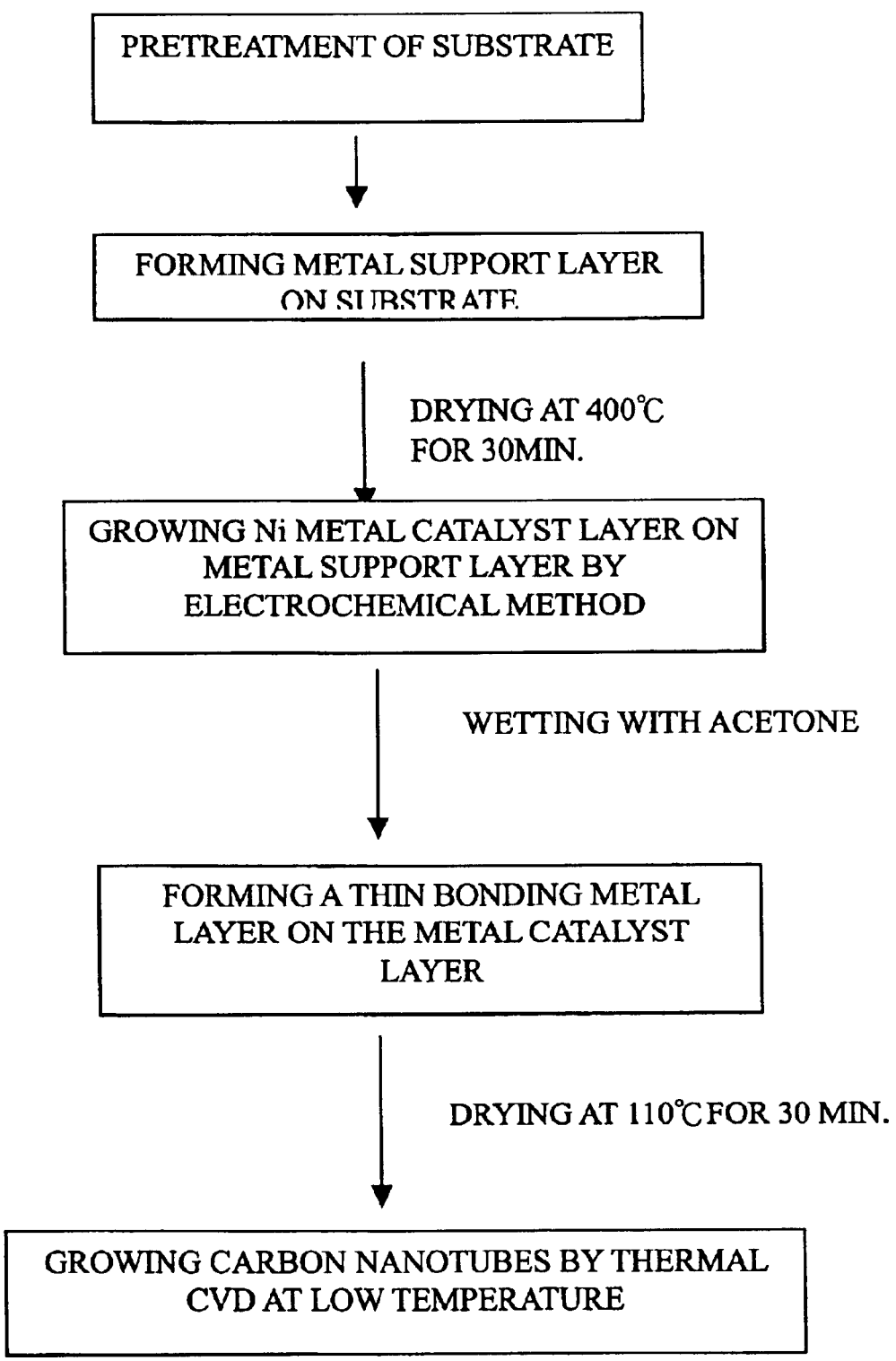
FIG. 1 is a schematic block diagram of a preferred embodiment of a process according to the present invention.

The invention of the present application discloses a process of direct low-temperature growth of carbon nanotubes on a substrate, which is different from a consuming-type growth of nano-grade catalytic metal particle disclosed in the abovementioned EP applications. The process of the present invention uses an addition method to prepare the catalyst. Firstly, the surface of a substrate is coated with a layer of a catalyst support, which does not need to be removed. That is the support will not affect the downstream process and the product thereof. Take the CNT-FED as an example. The silver particles in the silver paste can be used as the catalyst support. Since the silver paste is a necessary surface adhesive in the CNT-FED fabrication process, the catalyst support does not need to be removed from the substrate and can be directly used in the CNT-FED fabrication process. A layer of an active metal catalyst is then formed on the surface of the catalyst support; and a relatively thinner covering metal is finally formed on the active metal catalyst layer. The methods for forming such a three-layered metal layer include: vacuum sputtering, CVD, physical vapor deposition (PVD), screen printing, or electroplating, etc. Such a special catalyst system can be used to directly grow carbon nanotubes on the surface of the substrate in thermal CVD conditions, where the reaction temperature can be controlled below 600° C. and carbon nanotubes can still be grown at a fast rate and a large quantity.

In comparison with the prior arts, the process of the present invention has the following major advantages: (1) The synthesis of the catalyst system is simple, safe and easy to scale up. (2) An one-stage low temperature process is used. The process of the present invention is simple and safe and is far superior than the two-stage process which uses one stage of a high temperature pyrolysis and one stage of a low temperature carbonization. The one-stage low temperature process is advantageous in reducing the production cost of the CNT-FED. (3) The active metal catalyst layer can be formed by electroplating. The composition thereof is easy to be adjusted and controlled. The formation of the catalyst system can be integrated into the CNT-FED production process. (4) The catalyst system is a single reaction system, which does not require an additional assist catalyst substrate. (5) The catalyst system can be activated without using a plasma etching. Therefore, the production process can be simplified. (6) The bonding metal layer of the third layer is advantageous in the bonding between the grown carbon nanotube layer and the surface of the substrate.

A preferred embodiment of the process of direct low-temperature growth of carbon nanotubes on a substrate according to the present invention comprises the steps shown in FIG. 1. Firstly, a substrate was washed by immersing said substrate in acetone, followed by subjecting the substrate to an ultrasonic oscillation for 30 minutes. The substrate was then removed from the acetone and dried. This procedure is a pre-treatment. The objective of which is to thoroughly clean the surface of the substrate to facilitate the formation of the metal support. The abovementioned substrate can be silicon wafer, quartz glass, reinforced glass, sodium glass, ITO conductive glass or silicon oxide. Sodium glass was used in this example. A silver paste was coated on the substrate by screen printing. The composite was sintered in air at 400° C. for 30 minutes, thereby forming a metal support layer substantially comprising silver and having a thickness of 5–20 microns on the substrate. Said silver paste (bought from the Yeong-Shin Co. Ltd., Hsin-Chu City, Taiwan R.O.C., Commercial name: Print silver paste, Code: B-AP01) comprises 50–65 wt % of silver particles with a particle size of 1–5 microns, cellulose resin and dl-α-terpineol. An active metal catalyst layer was electroplated on said substrate, which was placed in an electrolyte solution as a cathode. The electrolyte solution contained a salt, such as nitrate or sulfate, of a transition metal, such as Fe, Co, Ni, etc. The concentration of the salt was 0.001M to 1M; and the time of electroplating was 5 s to 10 min. In this example, nickel nitrate at a concentration of 5 mM was used and the time of electroplating was 30–60 sec. The obtained active metal catalyst layer had a thickness of 5–30 microns. Upon completion, the composite was wetted by acetone and the active metal catalyst layer was coated with a diluted silver paste solution, which was prepared by dissolving 1 g of said silver paste in 9 g of acetone solvent. The coated substrate was oven dried at 100° C. for 30 minutes, thereby obtaining a bonding metal layer with a thickness of 5–15 microns.

The substrate having the abovementioned catalyst system was mounted in a CVD reactor for performing a thermal CVD. The reaction feed gas comprised an inert gas argon (flowrate 500 sccm), hydrogen (flowrate 75 sccm), and acetylene (flowrate 25 sccm) as a carbon source. The reaction temperature was 475° C., the reaction time was 3 minutes, and the reaction pressure was 1 atm. After the reactions, the surface of the substrate was directly grown with carbon nanotubes having a diameter of 30–70 nanometers. These carbon nanotubes can emit electrons at a low voltage.

What is claimed is:

1. A process of direct low-temperature growth of carbon nanotubes on a substrate, which comprises the following steps:

a) forming a metal support layer on a substrate;

b) forming a metal catalyst layer on said metal support layer;

c) forming a bonding metal layer on said catalyst metal layer; and d) growing carbon nanotubes on a surface of said substrate having said metal support layer, the metal catalyst layer and the bonding metal layer thereon by using a carbon source gas through a thermal chemical vapor deposition (CVD);

wherein said metal support layer and said bonding metal layer separately have a thickness of 0.1–50 microns, and the former is thicker than the later;

said metal support layer comprises a noble metal;

said bonding metal layer comprises a noble metal; and said metal catalyst layer comprises a metal selected from the group consisting of Fe, Co, Ni, and an alloy thereof.

2. The process as claimed in claim 1, wherein said metal support layer in Step (a) is formed by vacuum sputtering, CVD, physical vapor deposition (PVD), screen printing or electroplating.

3. The process as claimed in claim 2, wherein said metal support layer in Step (a) is formed by using said screen printing to coat a paste on said substrate, said paste being dispersed with particles of the noble metal having a particle size of 0.1–10 microns; and sintering the obtained coating layer.

4. The process as claimed in claim 1, wherein said metal catalyst layer in Step (b) is formed by vacuum sputtering, CVD, physical vapor deposition (PVD), screen printing or electroplating.

5. The process as claimed in claim 4, wherein said metal catalyst layer in Step (b) is formed by said electroplating.

6. The process as claimed in claim 1, wherein said bonding metal bonding layer in Step (c) is formed by vacuum sputtering, CVD, physical vapor deposition (PVD), screen printing or electroplating.

7. The process as claimed in claim 1, wherein said bonding metal layer in Step (c) is formed by coating a paste solution on said metal catalyst layer, said paste solution being dispersed with particles of the noble metal having a particle size of 0.1–10 microns; and drying the obtained coating layer.

8. The process as claimed in claim 1, wherein said metal support layer comprises silver, gold, Pt, Pd, or Cu.

9. The process as claimed in claim 8, wherein said metal support layer comprises silver.

10. The process as claimed in claim 8, wherein said metal catalyst layer comprises nickel.

11. The process as claimed in claim 1, wherein said metal support layer and said bonding metal layer comprise a same noble metal.

12. The process as claimed in claim 1, wherein said thermal CVD in Step (d) is carried out under conditions of: a reaction temperature of 400–600° C., a pressure of 0.5–2 atm, and a reaction time of 1–120 minutes; said carbon source gas comprises a hydrocarbon or carbon monoxide.

* * * * *